US012803561B2

(12) United States Patent
Bugade et al.

(10) Patent No.: US 12,803,561 B2

(45) Date of Patent: Nov. 17, 2026

(54) PHASE-LOCKED LOOP REFERENCE CLOCK SWITCHING WITH CONTROLLED OUTPUT TRANSIENT FREQUENCY DRIFT

(71) Applicant: NXP B.V., Eindhoven (NL)

(72) Inventors: Vishwajit Babasaheb Bugade, Kolhapur (IN); Anand Kumar Sinha, Noida (IN); Ateet Omer, Kanpur (IN); Ramen Dutta, Burdwan (IN); Deependra Kumar Jain, Noida (IN)

(73) Assignee: NXP B.V., Eindhoven (NL)

( * ) Notice: Subject to any disclaimer, the term of this patent is extended or adjusted under 35 U.S.C. 154(b) by 37 days.

(21) Appl. No.: 19/095,411

(22) Filed: Mar. 31, 2025

(65) Prior Publication Data

US 2025/0309903 A1 Oct. 2, 2025

(30) Foreign Application Priority Data

Apr. 2, 2024 (IN) ............................ 202441027241

(51) Int. Cl.
*H03L 7/091* (2006.01)
*H03L 7/18* (2006.01)

(52) U.S. Cl.
CPC ................ *H03L 7/091* (2013.01); *H03L 7/18* (2013.01)

(58) Field of Classification Search
None
See application file for complete search history.

(56) References Cited

U.S. PATENT DOCUMENTS

| | | | |
|---|---|---|---|
| 6,661,293 B2 | 12/2003 | Paananen | |
| 6,724,265 B2 | 4/2004 | Humphreys | |
| 6,741,109 B1 | 5/2004 | Huang et al. | |
| 6,853,224 B2 | 2/2005 | Asikainen et al. | |
| 7,352,251 B2 | 4/2008 | Krishnan et al. | |
| 7,486,147 B2 | 2/2009 | Khorram | |
| 9,680,484 B2 * | 6/2017 | Zhang | G06F 1/04 |
| 10,514,720 B1 | 12/2019 | J et al. | |
| 11,108,400 B1 * | 8/2021 | Armstrong | H03L 7/199 |
| 12,556,188 B2 * | 2/2026 | Jain | H03L 7/085 |
| 2006/0193417 A1 | 8/2006 | Jamison | |
| 2007/0274425 A1 | 11/2007 | Werker | |
| 2008/0063131 A1 | 3/2008 | Furuta | |
| 2019/0288694 A1 | 9/2019 | Parekh et al. | |

FOREIGN PATENT DOCUMENTS

| | | |
|---|---|---|
| EP | 3700091 A1 | 8/2020 |
| WO | 2023027078 A1 | 3/2023 |

* cited by examiner

*Primary Examiner* — Cassandra F Cox

(57) ABSTRACT

A reference clock switching controller for a PLL including select circuitry and a reset controller. The PLL includes a phase detector receiving a feedback clock and a selected reference clock, and a frequency divider receiving an output clock and providing the feedback clock. The select circuitry selects from among multiple reference clocks based on a select signal to provide the selected reference clock. The reset controller resets the phase detector in response to a transition of the select signal and releases the phase detector upon a following falling edge of the selected reference clock. The reset controller resets the frequency divider in response to the transition of the select signal and releases the frequency divider after the phase detector is released from reset upon a following rising edge of the selected reference clock. A phase limit controller limits phase error during clock switching by minimizing delay of feedback clock transitions.

20 Claims, 8 Drawing Sheets

PHASE-LOCKED LOOP REFERENCE CLOCK SWITCHING WITH CONTROLLED OUTPUT TRANSIENT FREQUENCY DRIFT

CROSS-REFERENCE TO RELATED APPLICATIONS

This application claims the priority under 35 U.S.C. § 119 of India application No. 202441027241, filed on 2 Apr. 2024, the contents of which are incorporated by reference herein.

BACKGROUND

Field

The present disclosure relates in general to phase-locked loop (PLL) circuits, and more particularly to a system and method of performing reference clock switching of PLL circuits with controlled output transient frequency drift.

Description of the Related Art

In high-speed data transfer networks or the like, phase-locked loop (PLL) circuits are extensively used for generating high frequency clocks using low frequency reference clocks from crystal oscillators or clock recovery circuits. In many advanced applications there are multiple reference clocks available with different frequencies. There is often a requirement of the PLL circuit to be able to switch between multiple reference clock signals based on their availability and mode of operation. It is desired, therefore, to provide a PLL circuit that can smoothly switch between multiple reference clocks with different frequencies and uncorrelated phases. The dominant constraint while performing reference clock switching is to maintain output clock frequency under certain parts-per-million (ppm) error and frequency change rate specification. A conventional PLL has a relatively high frequency glitch in response to a change in reference clock frequency or phase.

In conventional charge-pump PLL circuits, when it is desired to switch reference from one clock signal to other, there has been no control over the relative phase of the second clock with respect to the first clock. There can be some applications in which the two or more reference clocks could have different frequencies. At the time of reference clock switching, the phase difference between any two reference clocks directly translates to phase error, since in steady state operation before switching, the feedback clock would have been in phase with the first reference clock. In conventional PLL circuits this large phase error, which can be as high as one input clock time-period, causes a relatively large glitch in the output clock frequency and a relatively large transition time for the output frequency to settle.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A phase-locked loop (PLL) circuit as described herein ensures smooth transition during reference clock switching by minimizing phase error. A reset controller aligns a feedback clock with the newly selected reference clock with minimal phase error residue. The PLL control loop includes a phase detector (e.g., phase frequency detector) and a frequency divider. The reset controller resets the phase detector and the frequency divider in response to a transition of a reference clock select signal indicating selection of another reference clock. The reset controller re-enables the phase detector first upon the next falling edge of the newly selected reference clock, and then re-enables the frequency divider upon the following rising edge of the newly selected reference clock. The phase error residue can still be as high as one period of the output clock.

A phase limit controller may be included to further reduce phase error by limiting the phase error to a fixed delay value to keep a frequency glitch under a corresponding parts-per-million (ppm) specification during reference clock switching. The phase limit controller develops a delayed version of the selected reference clock with a delay value indicative of a maximum allowable phase error that meets the requisite specification. During reference clock switching and after the frequency divider is re-enabled, the phase limit controller logically combines the feedback clock with the delayed reference clock to generate a modified feedback clock that ensures that the phase error remains within specification during reference clock switching. When the feedback clock from the frequency divider synchronizes with the newly selected reference clock within the maximum allowable phase error, the phase limit controller resets to revert back to normal feedback loop control operation.

Figure 1:
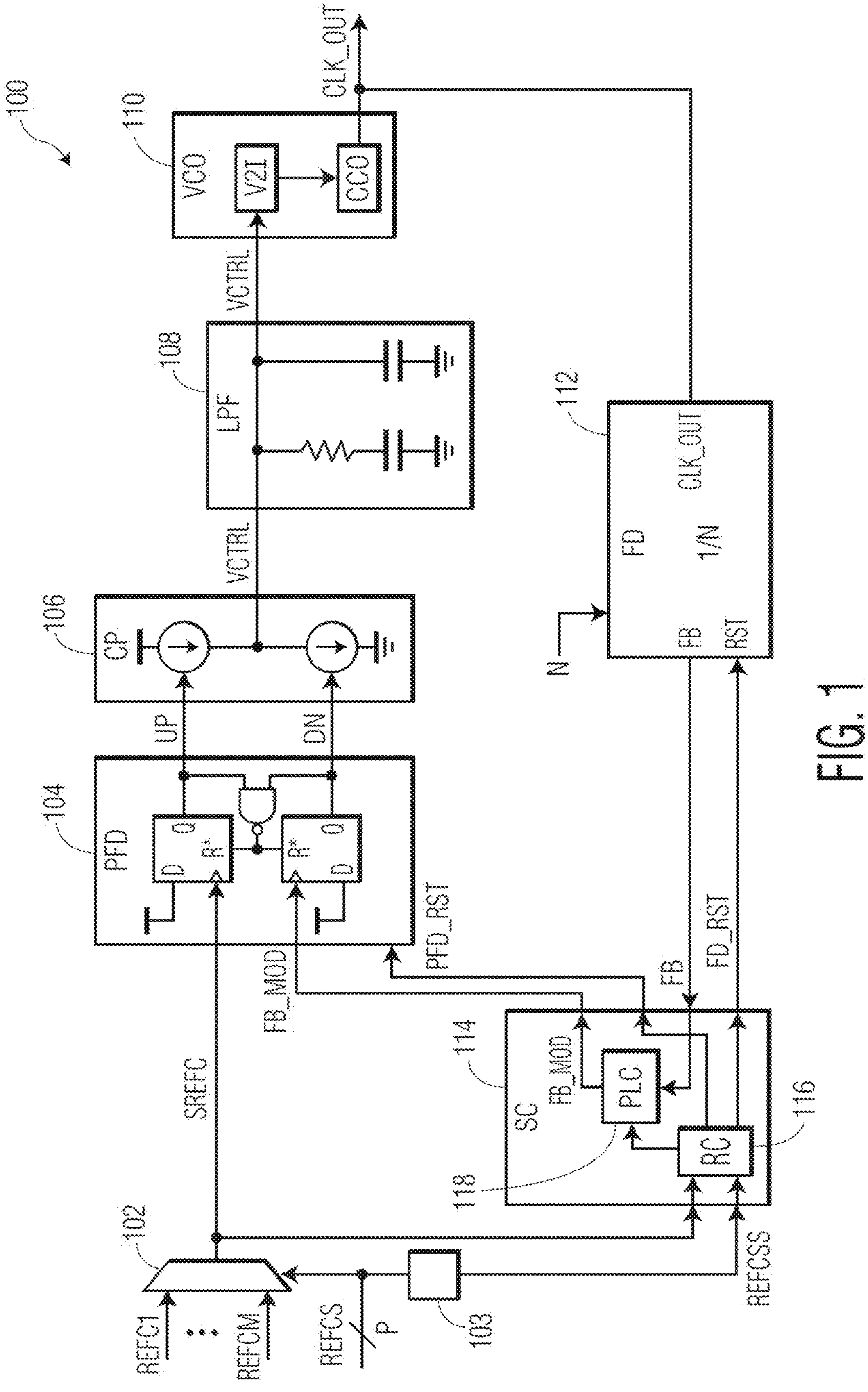
FIG. 1 is a simplified schematic and block diagram of a phase-locked loop (PLL) circuit implemented according to one embodiment.

FIG. 1 is a simplified schematic and block diagram of a PLL circuit 100 implemented according to one embodiment. The PLL circuit 100 includes an input clock selector in the form of a multiplexer (MUX) 102, a phase frequency detector (PFD) 104, a charge pump (CP) 106, a low-pass filter (LPF) 108, a voltage-controlled oscillator (VCO) 110, a frequency divider (FD) 112, and a switch controller (SC)

114. The MUX 102 receives a number "M" of reference clocks REFC1, . . . , REFCM (REFC1-REFCM) and outputs a selected reference clock SREFC based on a reference clock select signal REFCS provided to a select input of the MUX 102. REFCS may be a single binary signal for an embodiment in which M=2 when only two reference clocks REFC1 and REFC2 are provided to respective inputs of the MUX 102. However, when M>2, REFCS is correspondingly a multiple bit signal including an integer number of P bits in which M≤2P. A transition detect circuit 103 may be provided to generate a single-bit signal REFCSS that simply toggles in response to any transition of any bit of REFCS when selecting a different clock input. When M=2, the transition detect circuit 103 is not needed or otherwise asserts REFCSS the same as REFCS, or REFCSS=REFCS.

SREFC and REFCSS are provided to respective inputs of the SC 114. SREFC is also provided to a reference clock input of the PFD 104, which also receives a modified feedback clock FB_MOD at another input and which has outputs providing UP and DN control signals. The UP/DN signals are provided to respective inputs of the CP 106, which has an output providing a voltage control signal VCTRL. The LPF 108 is provided to filter the VCTRL signal, which is also provided to an input of the VCO 110. The VCO provides an output clock CLK_OUT, which is also fed back to an input of the FD 112. The FD 112 divides the frequency of CLK_OUT by N and provides a feedback (FB) clock to an input of the SC 114. The SC either forwards or modifies the FB clock as further described herein to provide the FB_MOD clock to the PFD 104.

In high-speed data transfer networks or the like, PLL circuits are extensively used for generating high frequency clocks using low frequency reference clocks from crystal oscillators or clock recovery circuits. In many advanced applications there are multiple reference clocks available with different frequencies. As shown, the PLL circuit 100 develops the output clock CLK_OUT based on a selected one of the M input reference clocks REFC1-REFCM, which may have the same frequency or may have different frequencies and which may be asynchronous with respect to each other with phase differences that vary from one reference clock to another.

In many configurations, there is requirement for a PLL circuit, such as the PLL circuit 100, for example, to be able to switch between these multiple reference clock signals based on their availability and mode of operation. It may be required, therefore, to have a PLL circuit which can smoothly switch from one reference clock to another with different frequencies and uncorrelated phases. A dominant constraint while performing reference clock switching is to maintain output clock frequency under certain parts-per-million (ppm) error and frequency change rate specification. Conventional PLL circuits often have a higher frequency glitch with a change in reference clock frequency or phase.

The PLL circuit 100 includes the SC 114 operative to meet switching requirements by resetting the PFD 104 and the FD 112 and enabling them with updated loop division ratio at right time to approximately align the FB clock with the selected reference clock SREFC, ensuring minimal phase/frequency error. As shown, the SC 114 further includes a reset controller (RC) 116 having inputs receiving SREFC and REFCSS, a first output providing a first reset signal FD_RST to a reset input of the FD 112, and a second output providing a second reset signal PFD_RST to a reset input of the PFD 104. In addition, to further control the transition arising from the small residue phase error, the PLL circuit 100 may further include phase limit controller (PLC) 118 operative to limit the phase error fed to the loop to a predefined value. As shown, the phase limit controller 118 receives FB from the FD 112 and provides FB_MOD, which ensures smooth reference clock switching transition even when the reference clock frequencies and phase alignment differ.

General operation of the PLL circuit 100 is first described while ignoring operation of the SC circuit 114, in which the FB_MOD clock is assumed to be the same as the FB clock (i.e., not modified). The PFD 104 holds UP and DN low when SREFC and FB are at the same level and phase aligned. The PFD 104 asserts the UP signal high and the DN signal low while SREFC is high and FB is low, and asserts the DN signal high and the UP signal low while FB is high and SREFC is low. When the UP signal is high, it drives an upper charge circuit to increase VCTRL, and when the DN signal is high, it drives a lower charge circuit low to decrease VCTRL. The LPF 108 may include resistor-capacitor circuit to filter out higher frequency noise. The VCO 110 includes a voltage to current converter and a current-controlled oscillator (CCO) to adjust the frequency of the CLK_OUT clock based on the voltage level of VCTRL. The FD 112 divides the frequency of CLK_OUT by N to develop the FB clock, which is passed as the FB_MOD clock to the PFD 104. Specific details of the PFD 104, the CP 106, the LPF 108, the VCO 110, and the FD 112 are not further described. The SC circuit 114 modifies operation to allow the PLL circuit 100 to smoothly switch between the reference clocks REFC1-REFCM with different frequencies and uncorrelated phases based on a change of REFCS. The PLL circuit 100 performs reference clock switching while maintaining output clock frequency under the operative ppm error and frequency change rate specifications as further described herein.

Figure 2:
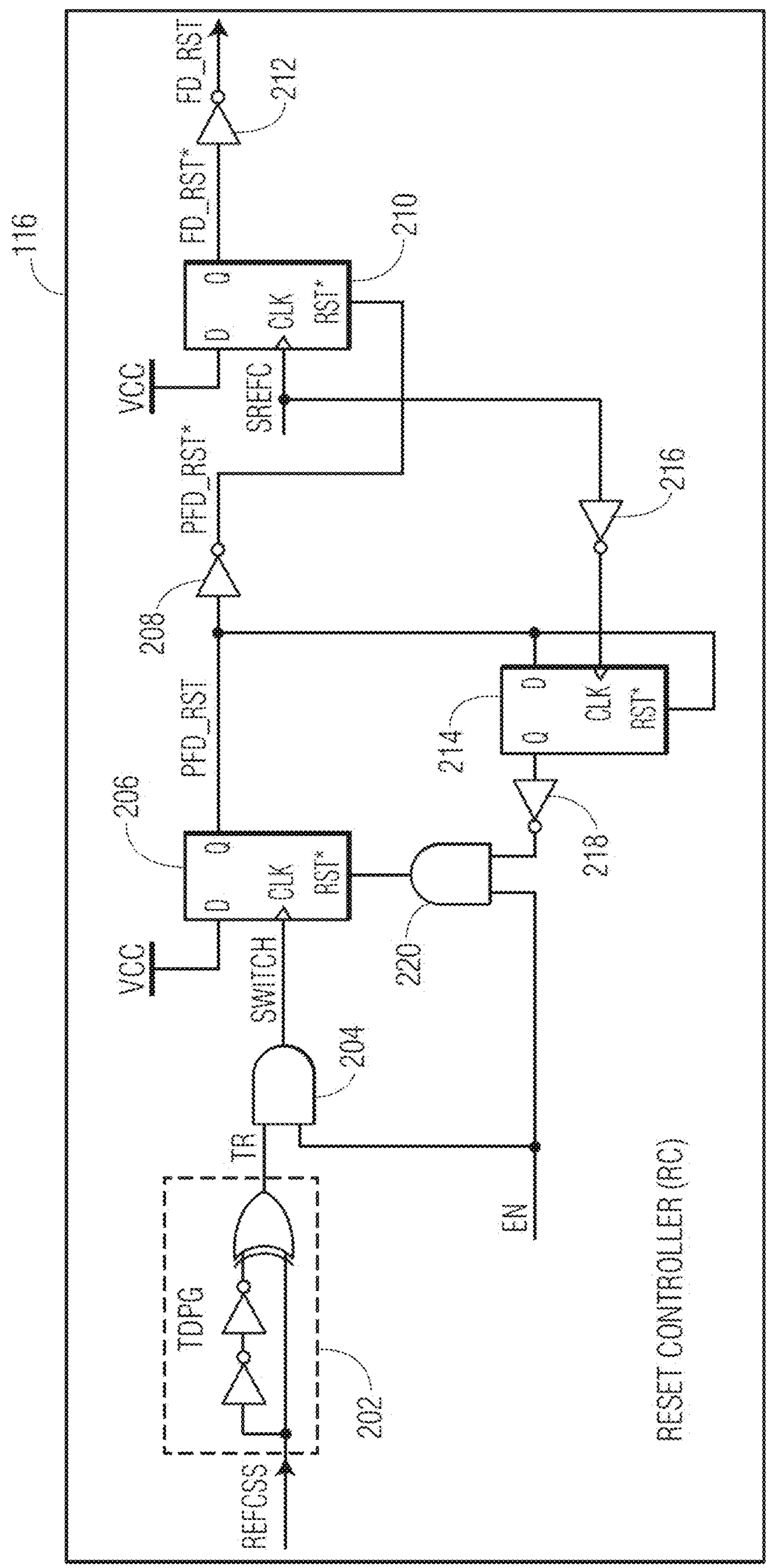
FIG. 2 is a schematic diagram of the reset controller of FIG. 1 implemented according to one embodiment.

FIG. 2 is a schematic diagram of the reset controller 116 implemented according to one embodiment. REFCSS (which equals the reference clock select signal REFCS for M=2 or is otherwise indicative of transitions of REFCS) is provided to an input of a transition detector and pulse generator (TDPG) 202, having an output providing a transition (TR) signal TR to one input of a 2-input Boolean logic AND gate 204. The TDPG 202 may be implemented in different ways, such as splitting REFCSS into two separate paths, in which one path is a delay path including a series of delay circuits (such as a set of inverters), and in which both paths are provided to respective inputs of a 2-input Boolean logic exclusive-OR (XOR) gate. In that case, TR is normally low but is pulsed high in response to any low-to-high or high-to-low transition of REFCSS (indicative of any transition of REFCS). The duration of the TR pulse is adjusted by the amount of delay of the delay path. The other input of the AND gate 204 receives an enable (EN) signal, which is assumed to be high for enabling operation of the reset controller 116. The output of the AND gate 204 provides a signal SWITCH, which is provided to a clock input of a D-type flip-flop (DFF) 206. The D input of the DFF 206 receives a supply voltage VCC which is high during normal operation representing a logic high value. The Q output of the DFF 206 provides the PFD_RST signal, which is provided to an input of an inverter 208 having an output providing an inverted version of PFD_RST, shown as PFD_RST*. It is noted that an asterisk "*" appended to a signal name or input/output (I/O) name denotes logical inversion unless otherwise specified.

PFD_RST* is provided to the inverting reset input (RST*) of another DFF 210 having a D input receiving VCC and a Q output providing an inverted version of FD_RST, shown as FD_RST*. FD_RST* is provided to an input of an inverter 212 having an output providing FD_RST. SREFC is provided to a clock input of the DFF 210 and to an input of an inverter 216, having its output coupled to a clock input of another DFF 214. DFF 214 has a D input and an RST* input receiving PFD_RST and a Q output coupled to an input of another inverter 218. The output of the inverter 218 is coupled to one input of another 2-input Boolean logic AND gate 220, having its other input receiving EN and its output coupled to the RST* input of DFF 206.

In operation of the reset controller 116 assuming enabled (i.e., EN is high), SWITCH pulses high in response to a transition of REFCSS (indicative of a transition of REFCS) clocking the DFF 206 to pull PFD_RST high to reset the PFD 104. PFD_RST* correspondingly goes low resetting the DFF 210 to pull FD_RST* low and FD_RST high to reset the FD 112. When the SREFC clock next goes low, the DFF 214 is clocked to pull its Q output high and to reset the DFF 206 to pull PFD_RST back low. When the SREFC clock next goes high after PFD_RST is pulled low in response to pulse on SWITCH, the DFF 210 is clocked to pull FD_RST back low. In this manner, the reset controller 116 resets both FD 112 and PFD 104 in response to any transition of REFCS to select another reference clock, re-enables PFD 104 (e.g., released from reset) when SREFC next goes low, and then re-enables FD 112 upon the following transition of SREFC from low to high.

Figure 3:
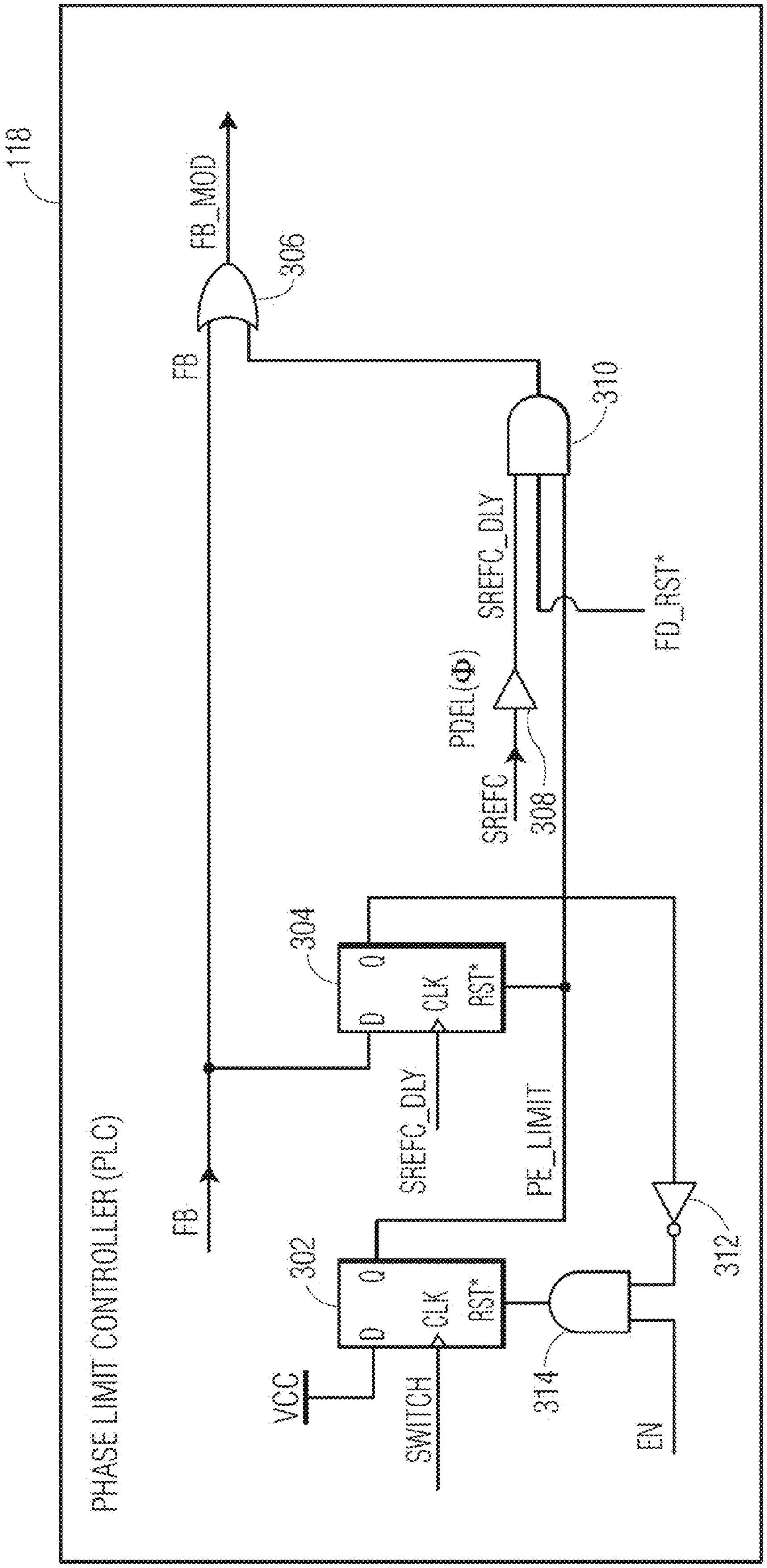
FIG. 3 is a schematic diagram of the phase limit controller of FIG. 1 implemented according to one embodiment.

FIG. 3 is a schematic diagram of the phase limit controller 118 implemented according to one embodiment. SWITCH is provided to a clock input of a DFF 302, receiving VCC at its D input and providing a phase limit signal PE_LIMIT at its Q output. The FB clock is provided to a D input of a DFF 304 and to one input of a 2-input Boolean logic OR gate 306, which has an output providing the FB_MOD clock. SREFC is provided to an input of a phase delay circuit 308 having a phase delay amount of PDEL=Φ, which has an output providing a delayed version of SREFC shown as SREFC_DLY. SREFC_DLY is provided to a clock input of DFF 304 and to one input of a 3-input Boolean logic AND gate 310, which receives FD_RST* at a second input and PE_LIMIT at a third input. The output of the AND gate 310 is provided to the other input of the OR gate 306. The DFF 304 receives PE_LIMIT at its RST* input and has a Q output provide to an input of an inverter 312. The output of the inverter 312 is provided to one input of another 2-input Boolean logic AND gate 314, receiving EN has its other input and having its output coupled to the RST* input of the DFF 302.

The use of the reset controller 116 ensures smooth transition during reference clock switching but may allow a phase error residue that can be as high as one period of the output clock signal CLK_OUT. If this phase error is too high in some configurations, then the phase limit controller 118 is used to limit phase error to a fixed value, PDEL=Φ, to ensure that any frequency glitch is under the ppm specification. Thus, PDEL is a maximum phase delay value based on the ppm specification. SREFC_DLY is a delayed version of SREFC in which the delay difference is PDEL.

In operation of the phase limit controller 118 when enabled (i.e., when EN is high), while PE_LIMIT is low, the FB_MOD clock is essentially the same as the FB clock (after minimal delay through the OR gate 306) in which SREFC_DLY is blocked by the AND gate 310. When SWITCH is pulsed high in response to a transition of REFCSS indicating a change of clock reference, PE_LIMIT goes high and FD_RST goes high resetting the FD 112 to pull FB low so that FB_MOD also goes low. Since FD_RST* goes low, SREFC_DLY remains blocked by the AND gate 310 while the FD 112 is reset. When FD_RST goes back low re-enabling the FD 112, FD_RST* goes high and FB_MOD becomes a logic-OR combination of FB and SREFC_DLY while PE_LIMIT remains high. If the FB clock does not transition high within a maximum allowable phase delay after the FD 112 is re-enabled, SREFC_DLY ensures that the FB_MOD clock transitions high within the maximum allowable phase delay as determined by PDEL. Eventually, when SREFC_DLY clocks the DFF 304 while FB is high, the Q output goes high and the AND gate 314 resets the DFF 302 to pull PE_LIMIT back low again to disable phase limiting during steady state operation. In this manner, the PE_LIMIT signal is negated when a phase difference between FB and SREFC is within the maximum allowable phase delay.

Figure 4:
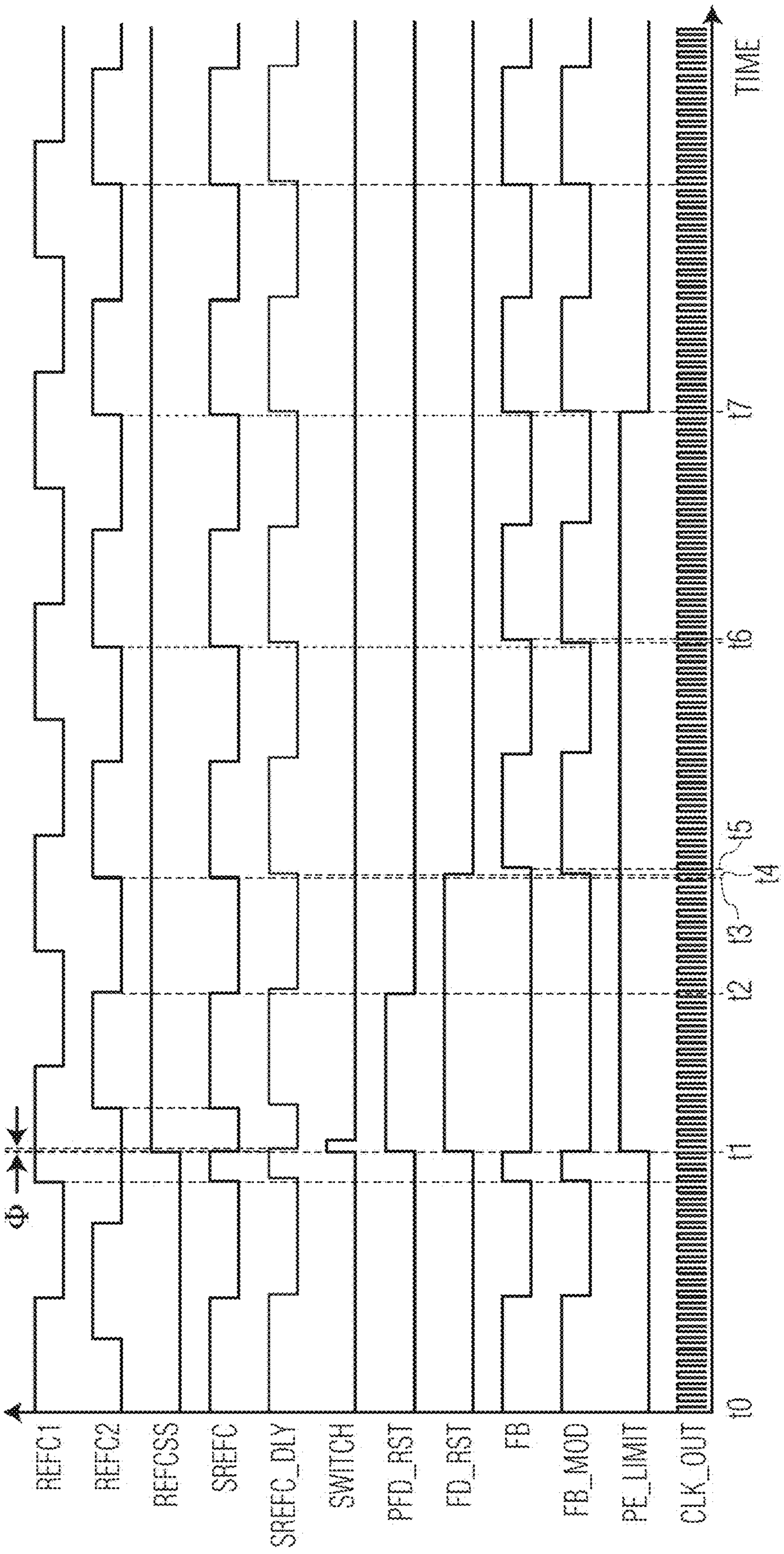
FIG. 4 is a timing diagram illustrating operation of the PLL circuit of FIG. 1 during switching between reference clocks for M=2 according to one embodiment.

FIG. 4 is a timing diagram illustrating operation of the PLL circuit 100 during switching between reference clocks for M=2 according to one embodiment. There are only two input reference clocks shown as REFC1 and REFC2 when M=2, where it is understood that operation is essentially the same for M>2 when switching between any two of more than two input reference clocks. The signals or clocks REFC1, REFC2, REFCSS, SREFC, SREFC_DLY, SWITCH, PFD_RST, FD_RST, FB, FB_MOD, PE_LIMIT, and CLK_OUT are plotted versus time for the case in which REFCS transitions to switch from REFC1 to REFC2. Beginning at a time t0, REFCSS is low and REFCS (not plotted) is asserted to initially select REFC1 so that the MUX 102 selects and forwards REFC1 as SREFC. SWITCH, PFD_RST, FD_RST, and PE_LIMIT are all initially low and SREFC_DLY is delayed relative to SREFC by delay value Φ. Operation is assumed to be in steady state in which the FB and FB_MOD clocks match the SREFC clock so that the PLL circuit 100 generates CLK_OUT having a frequency that is a multiple (N) of SREFC.

At a subsequent time t1, REFCS switches to select REFC2 as indicated by REFCSS transitioning high, so that the MUX 102 selects and forwards REFC2 as SREFC beginning at time t1. SWITCH pulses high at time t1 causing PFD_RST and FD_RST to both go high at time t1 to reset the PFD 104 and the FD 112, respectively, so that FB is pulled low. Also, PE_LIMIT goes high at time t1 to activate phase limiting. Although phase limiting is activated, since FD_RST* is low (opposite state of FD_RST), the toggling of the SREFC_DLY clock is blocked from FB_MOD so that the OR gate 306 keeps FB_MOD low based on FB. The time period beginning at time t1 is referred to as a dead-time in which the PFD 104 remains static (e.g., does not generate UP/DN pulses in the illustrated embodiment) to ensure that false phase error generation is avoided.

In the illustrated configuration, the reference clocks REFC1 and REFC2 are asynchronous but have substantially the same frequency. In this manner, the value of N used by the FD 112 is not modified. If, however, the frequencies of REFC1 and REFC2 were to be different, then N can be updated to a new value to reflect the frequency of REFC2 while FD 112 is reset during the clock change transition. Although not specifically shown, when the frequencies of the reference clocks REFC1 and REFC1 are different, the illustrated clock change transition is performed in a substantially similar manner as that shown for the same frequency.

At subsequent time t2, SREFC goes low so that PFD_RST is pulled back low to re-enable the PFD 104. At most, only one rising edge of SREFC may be missed during this time, which may be acceptable since during the relatively short dead time period, the output frequency of CLK_OUT does not vary much. Proper switching is ensured even when the REFCS signal and the REFC1 and REFC2 clocks and are asynchronous with respect to each other.

At subsequent time t3, SREFC goes back high so that FD_RST is pulled low to re-enable the FD 112. From time t3 onwards phase error computation is functional. The FD 112 is configured so that once it is re-enabled, upon next rising edge of CLK_OUT, the FB clock is pulled back high with relatively small delay based on CLK_OUT. Ideally, therefore, there can be a phase difference of up to one CLK_OUT time period between the SREFC and FB clocks, and this phase difference translates to a positive phase error since the rising edge of FB lags the rising edge of SREFC. It is noted, however, that if the time-period of CLK_OUT is comparatively large, the frequency glitch in the output frequency might otherwise violate requisite specification parameters. The phase limit controller 118, however, ensures a smooth transition by limiting the phase error to the fixed phase delay value PDEL=Φ to limit the positive phase difference between the SREFC and FB clocks.

As previously described, SREFC_DLY is a delayed version of SREFC in which the delay is the fixed maximum phase delay value PDEL=Φ. After time t3 when FD_RST goes low to re-enable the FD 112, FB_MOD becomes a modified version of FB with limited phase difference in which the rising edges of the FB_MOD clock coincides with the rising edges of the SREFC_DLY clock. The phase difference is limited until phase difference between SREFC and FB is under the PDEL limit. As shown, after time t3 FB does not go high until a subsequent time t5, in which the delay time from t3 to t5 is greater than PDEL. Instead of waiting until time t5, FB_MOD goes high sooner at an intermediate time t4 before time t5 to limit phase error. Similarly, at the next cycle of REFC2 at about time t6, FB_MOD is again asserted sooner than FB to limit the phase error. At subsequent time t7, FB is asserted within the PDEL maximum phase delay so that PE_LIMIT is pulled back low to terminate phase limit operation of the phase limit controller 118. Once the PE_LIMIT signal goes low, steady state is assumed to be achieved so that the phase limit controller 118 is disabled. This ensures normal PLL functionality until the next reference clock change.

Figure 5:
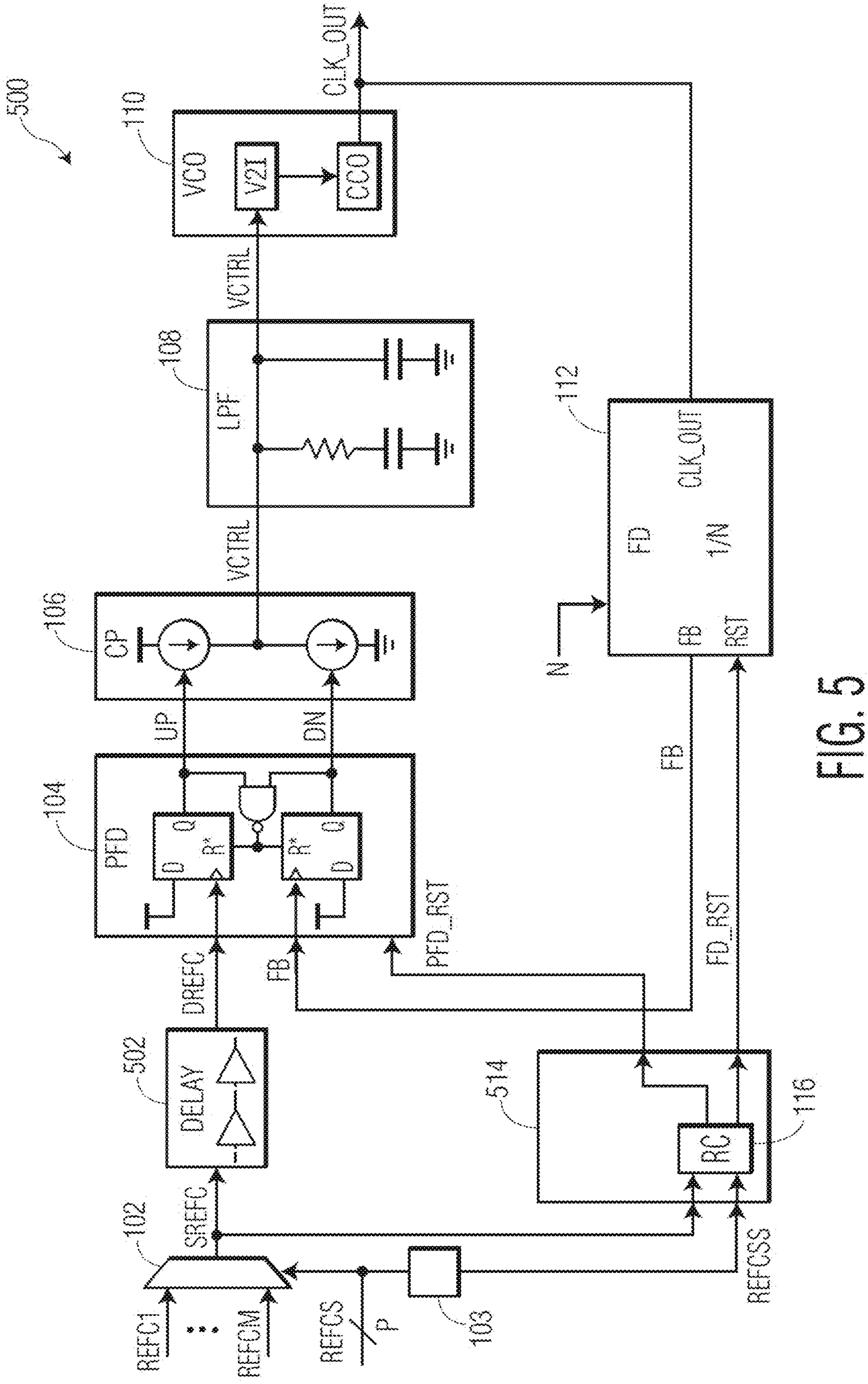
FIG. 5 is a simplified schematic and block diagram of a PLL circuit implemented according to another embodiment.

FIG. 5 is a simplified schematic and block diagram of a PLL circuit 500 implemented according to another embodiment, in which the PLL circuit 500 is substantially similar to the PLL circuit 100 and in which similar components assume identical reference numbers. The SC 114 is replaced by a similar SC 514 in which the phase limit controller 118 is eliminated. In this case, the FB clock output from the FD 112 is provided directly to the corresponding clock input of the PFD 104. In addition, a delay circuit 502 may be added having an input receiving the SREFC clock from the output of the MUX 102 and having an output providing a delayed version of SREFC, shown as a clock DREFC, which is instead provided to the corresponding input of the PFD 104.

As with the PLL circuit 100, the phase error residue can be maximum one period of the CLK_OUT signal. The CLK_OUT rising edge to rising edge of the FB clock can be referred to as an FB delay. The FB delay is the delay from first rising edge of CLK_OUT to the next rising edge of FB after the FD 112 is released from reset and re-enabled. In the event CLK_OUT has a sufficiently high frequency such that the period of CLK_OUT is sufficiently small, and if the phase error up to one period of CLK_OUT is acceptable to meet the output clock frequency glitch ppm constraints, additional phase limiting may not be needed, so that the phase limit controller 118 may be eliminated. However, when the period of CLK_OUT is sufficiently small, the FB delay can be comparable or even more than the period of CLK_OUT. In such case the FB delay can have a significant contribution to the phase error. Hence, this FB delay may be canceled by adding the delay block 502 to introduce about the same amount of delay in the SREFC path as shown.

Figure 6:
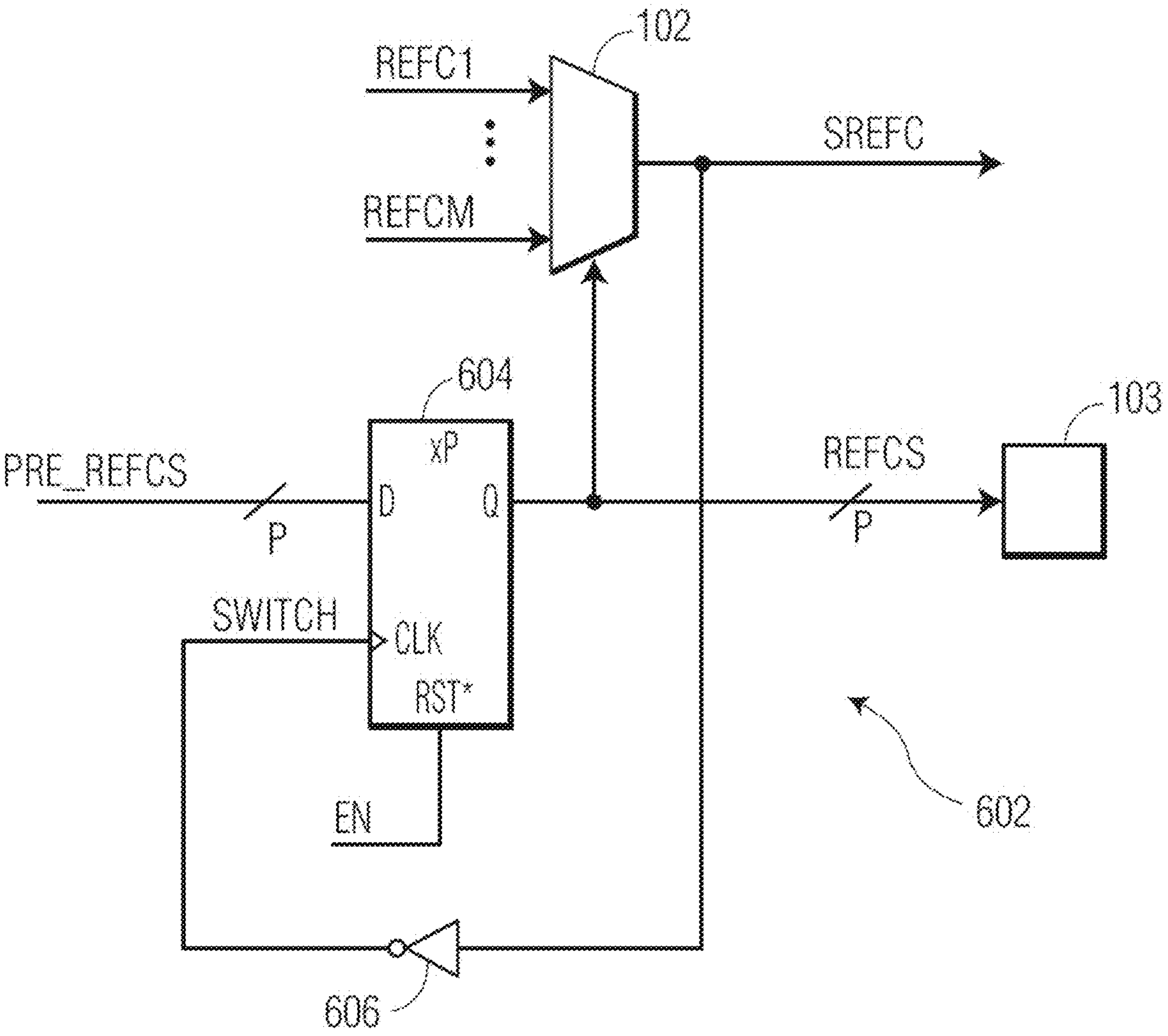
FIG. 6 is a schematic diagram of synchronization circuitry implemented according to one embodiment for synchronizing the reference clock select signal REFCS with the selected clock signal SREFC.

FIG. 6 is a schematic diagram of synchronization circuitry 602 implemented according to one embodiment for synchronizing the reference clock select signal REFCS with the selected clock signal SREFC. The MUX 102 is shown receiving the M reference clocks REFC1-REFCM and providing the selected clock signal SREFC based on the P-bit REFCS signal provided to the select input(s) of the MUX 102 in a similar manner as previously described. The synchronization circuitry 602 includes a set of P (xP) DFFs 604 and an inverter 606. Each of the set of P DFFs 604 has a D input receiving a corresponding one of a set of P preliminary reference clock select signals PRE_REFCS, a Q output providing a corresponding one of the P reference clock select signals REFCS, a clock input coupled to the output of the inverter 604, and an inverting reset input RST* receiving the EN signal. SREFC is provided to the input of the inverter 604.

A PLL circuit as described herein, including the PLL circuits 100 and 500 and similar configurations, is operative when the reference clocks are asynchronous with respect to each other. In the event that the phase offset in a particular application is high, and when resetting the PFD 104 near the rising edge of the selected reference clock SREFC is of concern, then the synchronization circuitry 602 may be used to synchronize REFCS with a falling edge of SREFC. This ensures that reference clock switching happens when the operative loop detector is reset into a passive state. For the illustrated embodiment, resetting the PFD 104 causes both of the UP and DN signals to be low and inactive.

Figure 7:
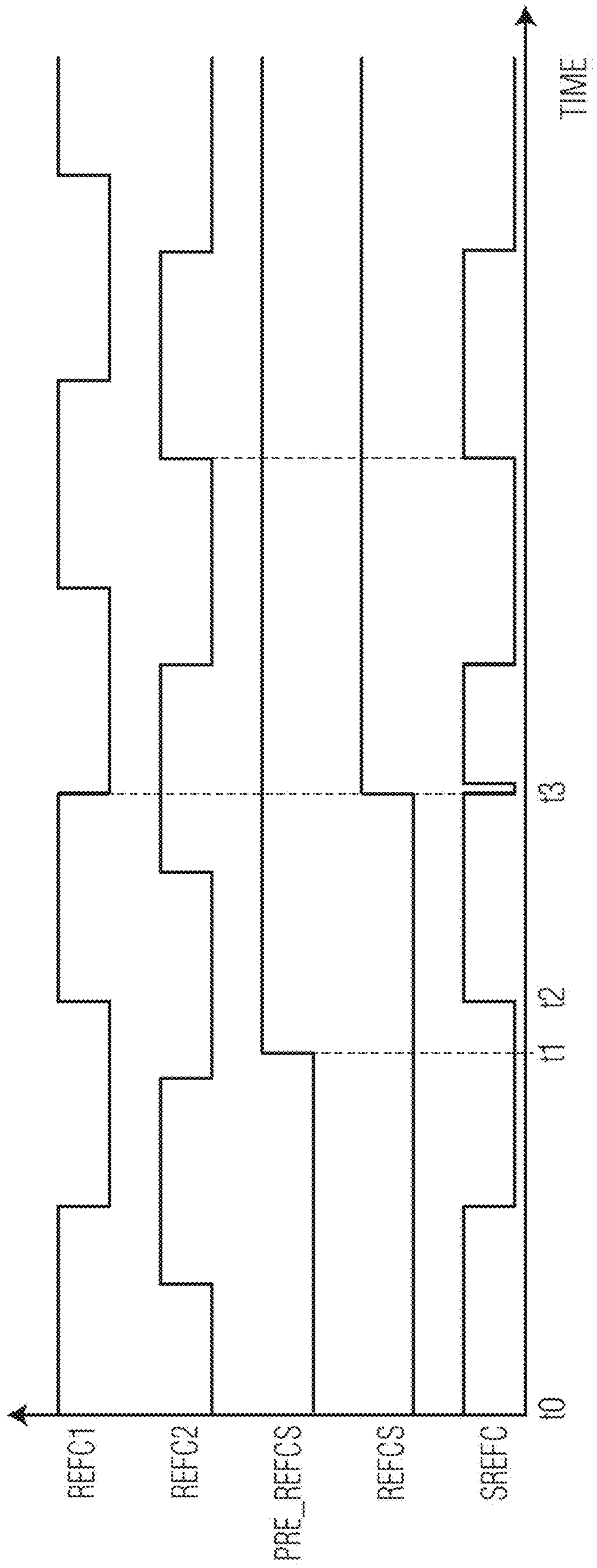
FIG. 7 is a timing diagram illustrating operation of the synchronization circuitry of FIG. 6 which may be used in any of the PLL circuits described herein for the limited case in which M=2 and P=1.

FIG. 7 is a timing diagram illustrating operation of the synchronization circuitry 602 which may be used in any of the PLL circuits described herein, such as either of the PLL circuits 100 and 500, for the limited case in which M=2 and P=1. The clocks or signals REFC1, REFC2, PRE_REFCS, REFCS, and SREFC are plotted versus time in which PRE_REFCS and REFCS are shown as 1-bit signals for simplified illustration. Operation for greater values of P and M operate in substantially the same manner.

Beginning at a time t0, REFCS is low so that REFC1 is selected as SREFC and PRE_REFCS is low. At a subsequent time t1, PRE_REFCS transitions high to indicate the intent to switch to REFC2 as the reference clock. At subsequent time t2, SREFC transitions high which does not clock the DFF 604 since the inverter 606 transitions its clock input low. In this manner, the PFD 104 is not reset at or near a rising edge of SREFC. At subsequent time t3, however, SREFC transitions low and the inverter 606 clocks the DFF 604 so that REFCS is pulled high to match PRE_REFCS and to select REFC2. Thus, reset of the PFD 104 is synchronized with the falling edge of SREFC rather than its rising edge. A short time later SREFC goes back high and SREFC now tracks REFC2.

Figure 8:
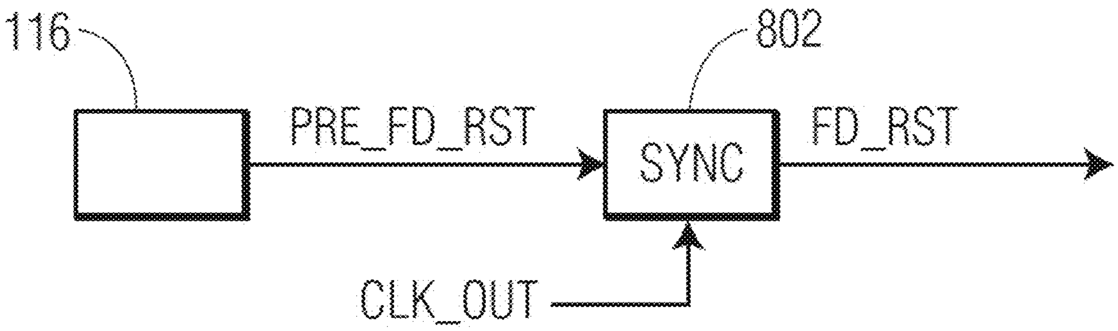
FIG. 8 is a simplified block diagram of reset synchronization circuitry implemented according to one embodiment which may be used to synchronize the FD_RST signal with the CLK_OUT signal.

FIG. 8 is a simplified block diagram of reset synchronization circuitry 802 implemented according to one embodiment which may be used to synchronize the FD_RST signal with the output clock CLK_OUT. Based on the architecture of the FD 112, it may be desired to synchronize the FD_RST signal with CLK_OUT clock. In some frequency divider architectures, for example, simultaneous arrival of the reset and clock signals to the FD 112 may cause undesired meta-stability issues. In order to avoid any such meta-stability issues, the release of the FD_RST signal to the FD 112 can instead be synchronized with the next falling edge of CLK_OUT using the reset synchronization circuitry 802. The reset controller 116 asserts a preliminary reset signal PRE_FD_RST rather than the FD_RST signal, in which PRE_FD_RST is provided to an input of the reset synchronization circuitry 802. The reset synchronization circuitry 802 has another input receiving CLK_OUT and has an output providing the FD_RST signal synchronized with falling edges of CLK_OUT.

Figure 9:
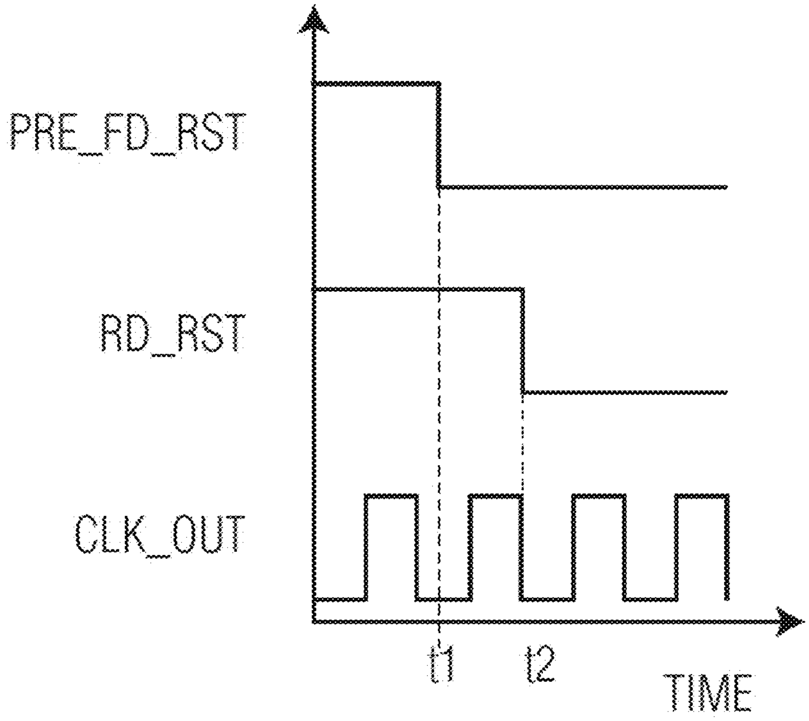
FIG. 9 is a timing diagram illustrating operation of the reset synchronization circuitry of FIG. 8 for synchronizing the FD_RST signal with CLK_OUT according to one embodiment.

FIG. 9 is a timing diagram illustrating operation of the reset synchronization circuitry 802 for synchronizing the FD_RST signal with CLK_OUT according to one embodiment. The timing diagram plots the signals PRE_FD_RST, FD_RST, and the CLK_OUT clock versus time. As shown in the timing diagram, PRE_FD_RST is asserted by the reset controller 116 at about a time t1, which is at or near the next rising edge of CLK_OUT. The reset synchronization circuitry 802 delays assertion of FD_RST until the next falling edge of CLK_OUT at time t2 to avoid any potential meta-stability issues of the FD 112. The specific details of the reset synchronization circuitry 802 are not shown, but it may be implemented with logic devices and circuitry, such as logic gates and flip-flops or the like.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

We claim:

1. A reference clock switching controller for a phase-locked loop (PLL), the PLL comprising a phase detector receiving a feedback clock and a selected reference clock and a frequency divider receiving an output clock and providing the feedback clock to the phase detector, the reference clock switching controller comprising:

select circuitry configured to select from among a plurality of reference clocks based on a reference clock select signal to provide the selected reference clock; and a reset controller configured to place the phase detector in reset in response to a transition of the reference clock select signal and to release the phase detector from reset upon a following falling edge of the selected reference clock, and configured to place the frequency divider in reset in response to the transition of the reference clock select signal and to release the frequency divider from reset after the phase detector is released from reset upon a following rising edge of the selected reference clock.

2. The reference clock switching controller of claim 1, wherein the reset controller comprises:

a transition detector that pulses a switch signal in response to the transition of the reference clock select signal;

a first flip-flop configured to assert a first reset signal used to reset the phase detector in response to a pulse of the switch signal;

a second flip-flop configured to assert a second reset signal used to reset the frequency divider in response to the first reset signal being asserted, and configured to negate the second reset signal to release the frequency divider from reset upon the next rising edge of the selected reference clock after the first reset signal is negated; and a third flip-flop configured to reset the first flip-flop to negate the first reset signal upon the next falling edge of the selected reference clock after assertion of the first reset signal.

3. The reference clock switching controller of claim 1, further comprising delay circuitry configured to delay the selected reference clock provided to the phase detector by a predetermined amount of time.

4. The reference clock switching controller of claim 1, further comprising a phase limit controller receiving the feedback clock and configured to provide a modified feedback clock to the phase detector instead of the feedback clock wherein the modified feedback clock transitions no later than a predetermined maximum delay time after the frequency divider is released from reset.

5. The reference clock switching controller of claim 4, wherein the phase limit controller comprises:

a first flip-flop configured to assert a phase limit signal in response to the transition of the reference clock select signal;

delay circuitry that delays the selected reference clock by the predetermined maximum delay time to provide a delayed reference clock;

logic circuitry that logically combines the feedback signal with the delayed reference clock to provide the modified feedback clock while the phase limit signal is asserted, and that provides the feedback signal as the modified feedback clock while the phase limit signal is negated; and a second flip-flop that resets the first flip-flop to negate the phase limit signal when a phase difference between the feedback clock and the selected reference clock is within the predetermined maximum delay time.

6. The reference clock switching controller of claim 1, further comprising synchronization circuitry configured to synchronize the reference clock select signal with the selected reference clock.

7. The reference clock switching controller of claim 1, further comprising synchronization circuitry configured to synchronize a reset signal used to reset the frequency divider with the output clock.

8. A phase-locked loop, comprising:

a phase detector configured to generate a phase error signal based on a selected reference clock and a feedback signal;

a charge pump configured to convert the phase error signal into a control signal;

a low-pass filter configured to filter the control signal;

a voltage-controlled oscillator configured to generate an output clock based on the control signal;

a frequency divider configured to divide a frequency of the output clock to provide the feedback signal; and a reference clock switching and control circuit, comprising:

select circuitry configured to select from among a plurality of reference clocks based on a reference clock select signal to provide the selected reference clock; and a reset controller configured to place the phase detector in reset in response to a transition of the reference clock select signal and to release the phase detector from reset upon a following falling edge of the selected reference clock, and configured to place the frequency divider in reset in response to the transition of the reference clock select signal and to release the frequency divider from reset after the phase detector is released from reset upon a following rising edge of the selected reference clock.

9. The phase-locked loop of claim 8, wherein the reset controller comprises:

a transition detector that pulses a switch signal in response to the transition of the reference clock select signal;

a first flip-flop configured to assert a first reset signal used to reset the phase detector in response to a pulse of the switch signal;

a second flip-flop configured to assert a second reset signal used to reset the frequency divider in response to the first reset signal being asserted, and configured to negate the second reset signal to release the frequency divider from reset upon the next rising edge of the selected reference clock after the first reset signal is negated; and a third flip-flop configured to reset the first flip-flop to negate the first reset signal upon the next falling edge of the selected reference clock after assertion of the first reset signal.

10. The phase-locked loop of claim 8, further comprising delay circuitry configured to delay the selected reference clock provided to the phase detector by a predetermined amount of time.

11. The phase-locked loop of claim 8, further comprising a phase limit controller receiving the feedback clock and configured to replace the feedback clock used by the phase detector with a modified feedback clock wherein the modified feedback clock transitions no later than a predetermined maximum delay time after the frequency divider is released from reset.

12. The phase-locked loop of claim 11, wherein the phase limit controller comprises:

a first flip-flop configured to assert a phase limit signal in response to the transition of the reference clock select signal;

delay circuitry that delays the selected reference clock by the predetermined maximum delay time to provide a delayed reference clock;

logic circuitry that logically combines the feedback signal with the delayed reference clock to provide the modified feedback clock while the phase limit signal is asserted, and that provides the feedback signal as the modified feedback clock while the phase limit signal is negated; and a second flip-flop that resets the first flip-flop to negate the phase limit signal when a phase difference between the feedback clock and the selected reference clock is within the predetermined maximum delay time.

13. The phase-locked loop of claim 8, further comprising synchronization circuitry configured to synchronize the reference clock select signal with the selected reference clock.

14. The phase-locked loop of claim 8, further comprising synchronization circuitry configured to synchronize a reset signal used to reset the frequency divider with the output clock.

15. A method of switching between a plurality of reference clocks for a phase-locked loop (PLL), the PLL comprising a phase detector receiving a feedback clock and a selected reference clock based on a clock switch signal and a frequency divider receiving an output clock and providing the feedback clock to the phase detector, the method comprising:

selecting from among the plurality of reference clocks based on a reference clock select signal to provide the selected reference clock; and placing the phase detector in reset in response to a transition of the reference clock select signal;

releasing the phase detector from reset upon a following falling edge of the selected reference clock;

placing the frequency divider in reset in response to the transition of the reference clock select signal; and releasing the frequency divider from reset after the phase detector is released from reset upon a following rising edge of the selected reference clock.

16. The method of claim 15, further comprising:

pulsing a switch signal in response to the transition of the reference clock select signal;

asserting a first reset signal used to reset the phase detector in response to the pulsing of the switch signal;

asserting a second reset signal used to reset the frequency divider in response to the first reset signal being asserted;

negating the second reset signal to release the frequency divider from reset upon the next rising edge of the selected reference clock after the first reset signal is negated; and negating the first reset signal upon the next falling edge of the selected reference clock after assertion of the first reset signal.

17. The method of claim 15, further comprising delaying the selected reference clock provided to the phase detector by a predetermined amount of time.

18. The method of claim 15, further comprising providing a modified feedback clock to the phase detector instead of the feedback clock wherein the modified feedback clock transitions no later than a predetermined maximum delay time after the frequency divider is released from reset.

19. The method of claim 18, further comprising:

asserting a phase limit signal in response to the transition of the reference clock select signal;

delaying the selected reference clock by the predetermined maximum delay time for providing a delayed reference clock;

logically combining the feedback signal with the delayed reference clock for providing the modified feedback clock while the phase limit signal is asserted, and providing the feedback signal as the modified feedback clock while the phase limit signal is negated; and negating the phase limit signal when a phase difference between the feedback clock and the selected reference clock is within the predetermined maximum delay time.

20. The method of claim 15, further comprising:

synchronizing the reference clock select signal with the selected reference clock; and synchronizing a reset signal used to reset the frequency divider with the output clock.

* * * * *